(12) United States Patent
Nakano et al.

(10) Patent No.: US 6,549,419 B1
(45) Date of Patent: Apr. 15, 2003

(54) ELECTRONIC SUBSTRATE AND METHOD FOR MANUFACTURING ELECTRONIC EQUIPMENT USING THE SAME

(75) Inventors: Toshifumi Nakano, Sagamihara (JP); Kuniko Morisaki, Hachioji (JP)

(73) Assignee: Olympus Optical Co., Ltd., Tokyo (JP)

( * ) Notice: Subject to any disclaimer, the term of this patent is extended or adjusted under 35 U.S.C. 154(b) by 0 days.

(21) Appl. No.: 09/684,175

(22) Filed: Oct. 6, 2000

(30) Foreign Application Priority Data

Oct. 13, 1999 (JP) .......................................... 11-291342

(51) Int. Cl.⁷ .............................. H05K 1/00; H05K 7/08
(52) U.S. Cl. ........................ 361/749; 361/748; 174/254
(58) Field of Search ................... 29/829–842, 412–417; 361/749, 755–760, 783–785; 174/250–268

(56) References Cited

U.S. PATENT DOCUMENTS

| | | | | |
|---|---|---|---|---|
| 4,243,495 A | * | 1/1981 | Trott ............................ | 204/11 |
| 4,343,084 A | * | 8/1982 | Wilmarth ...................... | 29/843 |
| 4,700,880 A | * | 10/1987 | Glover ...................... | 228/180.1 |
| 5,233,754 A | * | 8/1993 | Matsunaga .................... | 29/848 |
| 5,917,158 A | * | 6/1999 | Takao .......................... | 174/254 |
| 6,023,841 A | * | 2/2000 | Concorso ..................... | 29/840 |

FOREIGN PATENT DOCUMENTS

JP          4-46868          7/1992

* cited by examiner

*Primary Examiner*—David Martin
*Assistant Examiner*—Michael L. Lindinger
(74) *Attorney, Agent, or Firm*—Frishauf, Holtz, Goodman & Chick, P.C.

(57) ABSTRACT

To keep a flexible printed substrate planar when the substrate is set in a mounter for mounting parts and to miniaturize the substrate, the present invention proposes an electric substrate, for example, a flexible printed substrate on which electronic parts are mounted, the electric substrate having a first area (30: a part mounting area) formed therein, a second area (40: part mounting area) formed therein, and a third area (10: a separable area) that joins the first and second areas like a "bridge" and that can be removed when the substrate is assembled into predetermined equipment, the third area having a positioning hole 11 (one of a set of positioning holes) for use in mounting electric parts on the substrate.

12 Claims, 4 Drawing Sheets

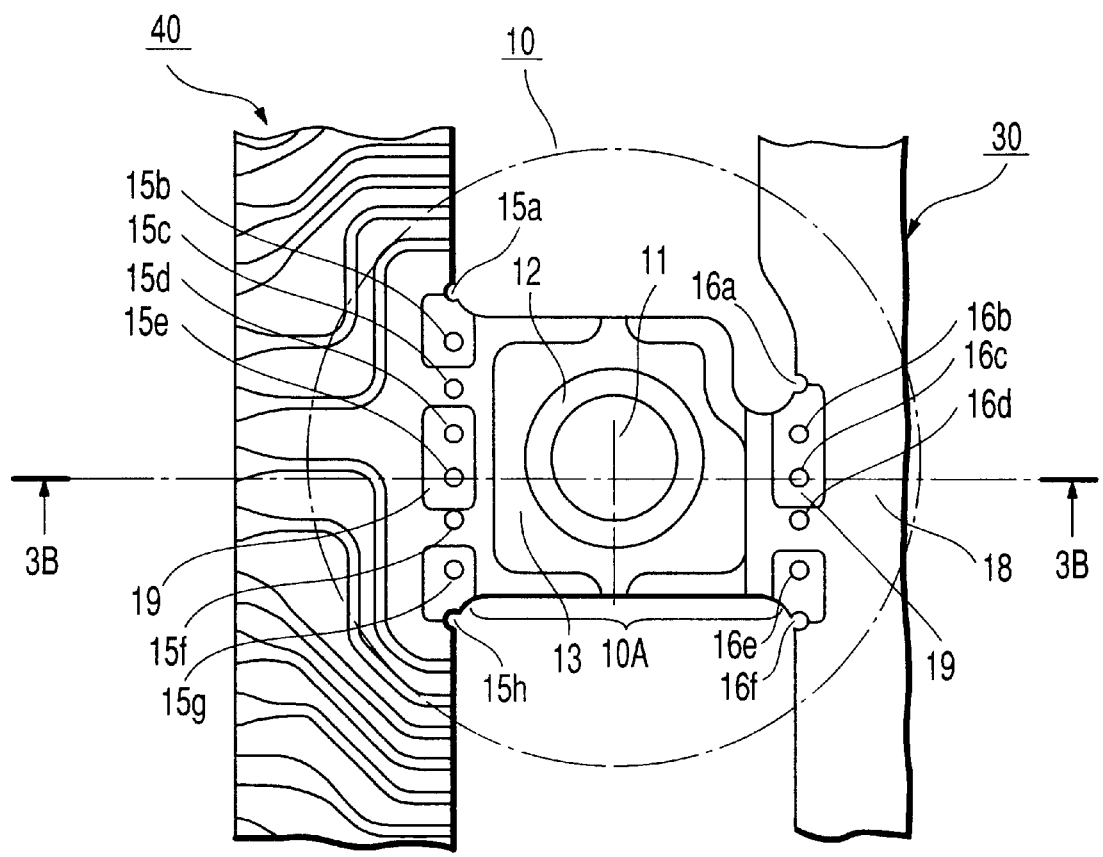
F I G. 3A
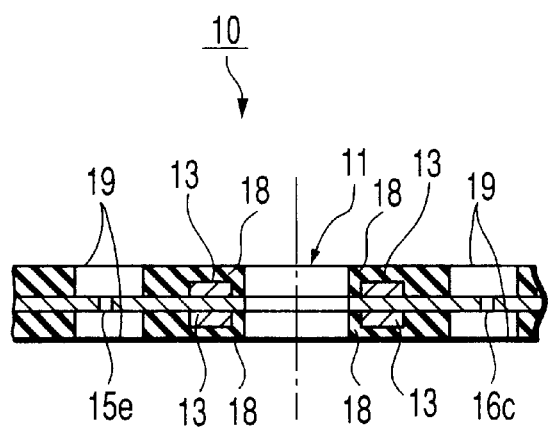
F I G. 3B

ELECTRONIC SUBSTRATE AND METHOD FOR MANUFACTURING ELECTRONIC EQUIPMENT USING THE SAME

CROSS-REFERENCE TO RELATED APPLICATIONS

This application is based upon and claims the benefit of priority from the prior Japanese Patent Application No. 11-291342, filed Oct. 13, 1999, the entire contents of which are incorporated herein by reference.

BACKGROUND OF THE INVENTION

The present invention relates to an electric substrate and a method for manufacturing a product using this electric substrate, and for example, to a flexible printed substrate for mounting in a camera.

In designing a flexible printed substrate, positioning holes must typically be formed which define the correct position relative to a mounter machine for mounting a predetermined electric part on the substrate. For example, when a mounter machine is used to mount a part such as a chip on a flexible printed substrate, which is to be assembled into a camera, at least a set of through-holes must be opened in the printed substrate at predetermined positions.

A set of small holes separated as far as possible are conventionally formed in a printed substrate with a circuit pattern design applied thereto, so as to be used for positioning for a mounter. For example, as disclosed in Jpn. Pat. Appln. KOKAI Publication No. 60-106751 for a technique for mounting an electric substrate, small holes in a flexible substrate are fitted over pins projected on a palette for positioning, and a mounting operation is then performed with this substrate held in tight contact with the palette in a vacuum.

These positioning holes in the substrate are desirably formed at positions that do not affect the arrangement of the circuit pattern, but the installation positions of the positioning holes have been easily determined fortunately because the circuit pattern arranged in the conventional printed substrate has a relatively low formation density.

Recent cameras composed of electronic devices, however, are smaller and have more advanced functions, so that the degree of freedom is substantially limited in mounting a flexible printed substrate assembled into the device. The density of the circuit pattern is also increasing to enhance the functions of the circuit, resulting in the need to further reduce a pattern width. No prior art documents, however, describe the above described problem with the positioning of the flexible printed substrate in detail.

One of the problems is that it is very difficult to find spaces on a flexible printed substrate in which positioning holes for a mounter machine are formed, the flexible printed substrate being designed to have a high-density pattern and that no positioning hole may be formed on the substrate depending on the relationship between the layout and pattern design of the printed substrate assembled into the camera main body.

Additionally, as shown in FIG. 4, particularly the shape of a flexible printed substrate 100 three-dimensionally assembled into a camera tends to be increasingly complicated as the camera becomes smaller and its functions become more advanced. Thus, the main printed substrate 100 main body has a large number of small substrates branching therefrom, so that it is difficult to keep the substrate two-dimensionally developed, thereby hindering the correct positioning relative to a mounter machine (not shown).

Furthermore, since a base of the printed circuit board 100 is made of a very thin film or the small substrates branch in every direction from the main body and are very flexible, a mounting area 20, 30, 40, 50, or 60 is relatively "twisted" or "peeled off" from a palette surface while parts are being mounted, thereby preventing maintenance of the planarity of the printed substrate 100 developed on the palette.

For the printed substrate 100 in FIG. 4, to avoid a high-density circuit pattern (not shown), for example, a semicircular recess 51 that is not fully circular are formed on the flexible printed circuit main body as a desperate measure, to temporarily form a set of positioning holes 51 and 61, which also serve to stop the printed circuit 100 from rotating.

As described above for the recent cases, the entire substrate is designed to have a slightly larger total area so that the positioning holes for the mounter machine do not affect high-density pattern sections or high-density part mounting sections of the circuit.

Preferably, however, the flexible printed substrate must be able to maintain its planarity on the mounter machine without increasing the total area of the entire substrate when it is assembled into a product.

It is an object of the present invention to provide a small electric substrate having positioning holes and which maintains the planarity of a flexible printed substrate when set in a mounter to mount parts.

BRIEF SUMMARY OF THE INVENTION

To attain the above object, the present invention proposes an electric substrate (for example, flexible printed substrate) having positioning holes and on which electric parts are mounted, having a first area (a part mounting area) formed therein, a second area (part mounting area) formed therein, and a third area (a separable area) that joins the first and second areas like a "bridge" and that can be removed when the substrate is assembled into a predetermined equipment, the third area having a positioning hole (one of a set of positioning holes) for use in mounting electric parts on the substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3A and 3B show an integral part of the electric substrate according to the present invention, which is characteristic thereof, FIG. 3A is a partly enlarged view showing this integral part, and FIG. 3B is a partial sectional view showing a cross section of the integral part.

DETAILED DESCRIPTION OF THE INVENTION

An electric substrate according to the present invention has a positioning hole, and even if it is difficult to form, without affecting a high-density pattern, a positioning hole for a mounter on a printed substrate main body with a high-density pattern circuit disposed thereon, the positioning hole can be temporarily formed in a spatial area (positioning substrate section) separate from high-density pattern design and part mounting areas in the printed substrate main body to join branched small substrates together like a "bridge". After a mounting operation, the positioning substrate section can be separated and thrown off.

Figure 4:
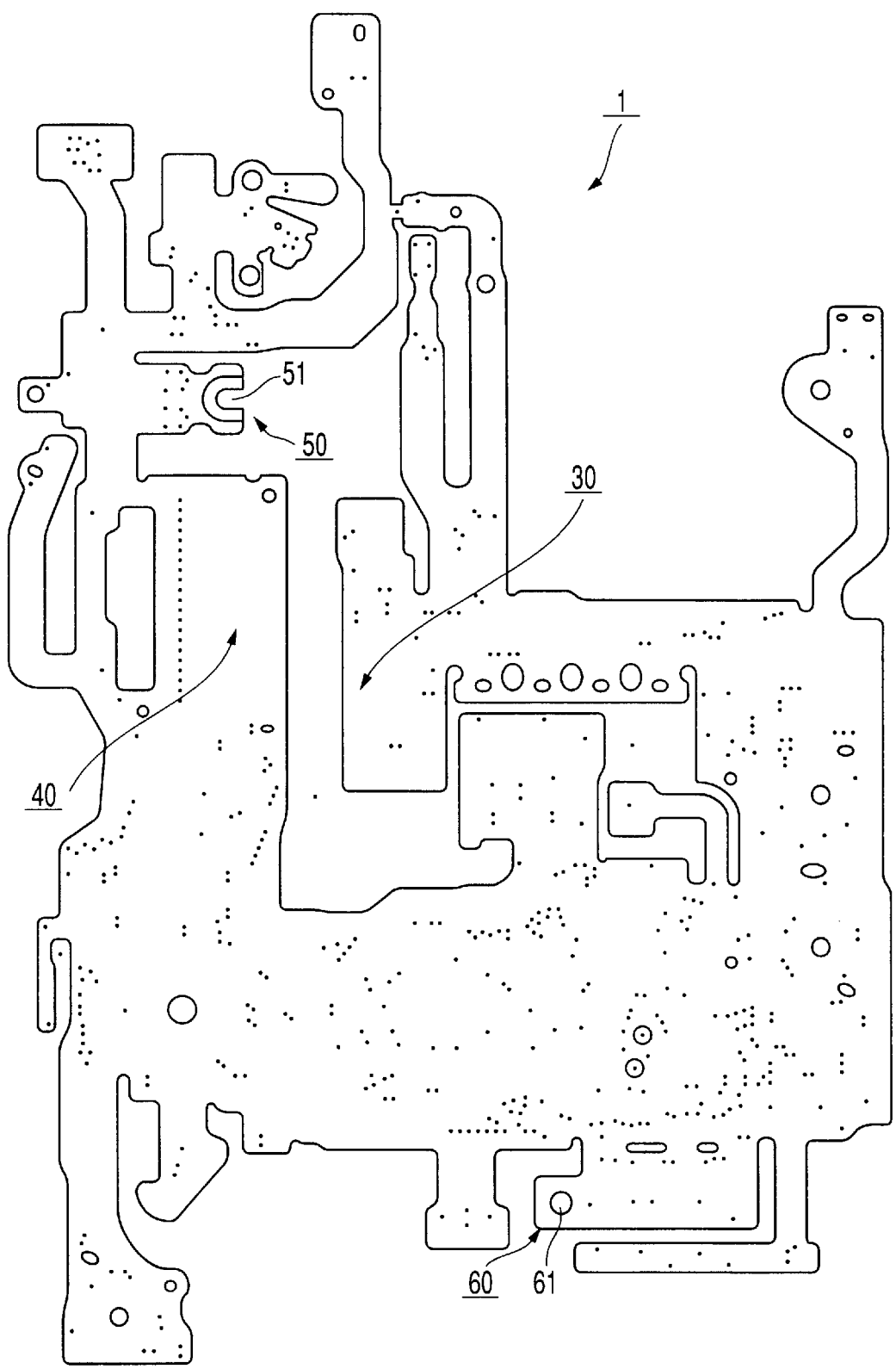
FIG. 4 is a plan development showing the shape of a base of a conventional printed substrate.

The spirits of the present invention will be described below taking specific embodiments by way of example. A flexible printed substrate 1 shown in FIGS. 1 and 2 and an integral part thereof shown in FIGS. 3A and 3B in an enlarged view indicate an embodiment to which the present invention has been applied, particularly an example of the flexible printed substrate 1, which is equivalent to that in FIG. 4 and has too high a density to form a positioning hole therein particularly due to the relationship between a layout and a pattern design, wherein positioning holes 11 and 21 according to the present invention are formed therein as a set of positioning holes for use in using a mounter machine (not shown) to mount electronic parts.

Figure 1:
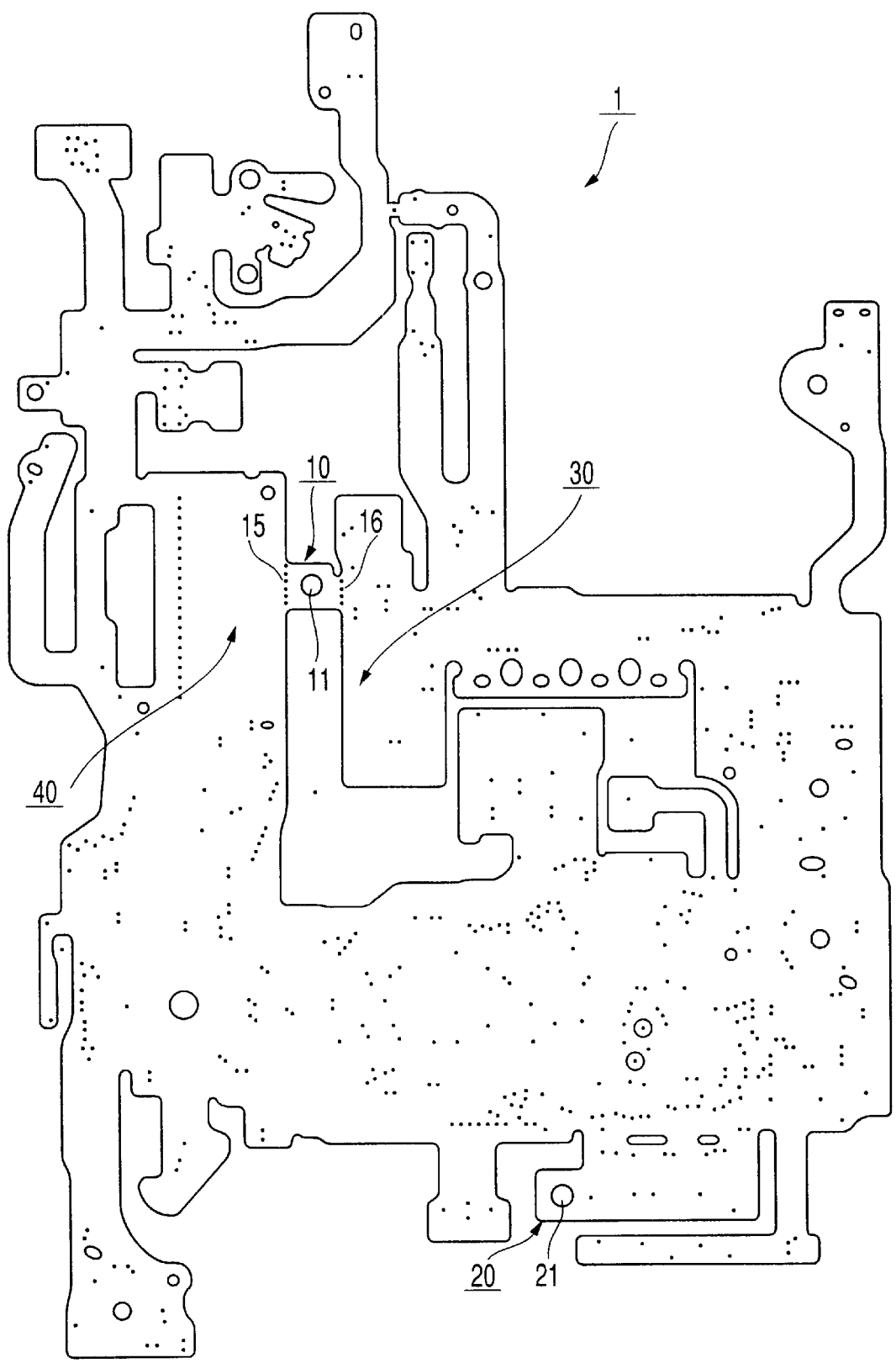
FIG. 1 is a plan development of a printed substrate showing the shape of a base of an electric substrate according to the present invention having a circuit pattern formed thereon.

FIG. 1 illustrates the shape of a base of the flexible printed substrate 1 in a plan development. This shape is a developed shape unique to the flexible printed substrate 1 assembled into a certain electronic equipment product, for example, a camera; the substrate has a plurality of part mounting areas (a first area 30, a second area 40, and other areas) formed on a surface thereof. A complicated circuit pattern, which is not shown in FIG. 1, is formed on front and rear surfaces of the base to form a two-layer substrate.

An electric circuit must have at least one set of substrate positioning holes (through-holes; two holes 11 and 21) for positioning for mounting parts, but since this flexible printed substrate 1 has no space for such holes due to a dense printed circuit pattern, a new space is formed in a site (that is, a positioning substrate section 10) separate from this substrate 1 main body so that the positioning hole 11 can be formed in this section. This section is then used to tie two small branching substrates including the mounting areas 30 and 40.

At least one of the positioning substrate sections 10 and 20 serves to form a positioning hole separate from the printed substrate 1 main body and also functions as an area tying the adjacent mounting areas 30 and 40 together like a "bridge".

The positioning substrate section 10, however, is formed so as to be easily separable (this will be described below in detail). Thus, separating the section 10 avoids increasing the substantial total area of the substrate 1 compared to that in FIG. 4.

The circular positioning holes 11 and 21 are formed in the positioning substrate section 10 and 20, respectively; since "positioning accuracy" increases consistently with the distance between the two holes 11 and 21, the layout of the positioning substrate sections 10 and 20 is designed with this point taken into consideration.

Figure 2:
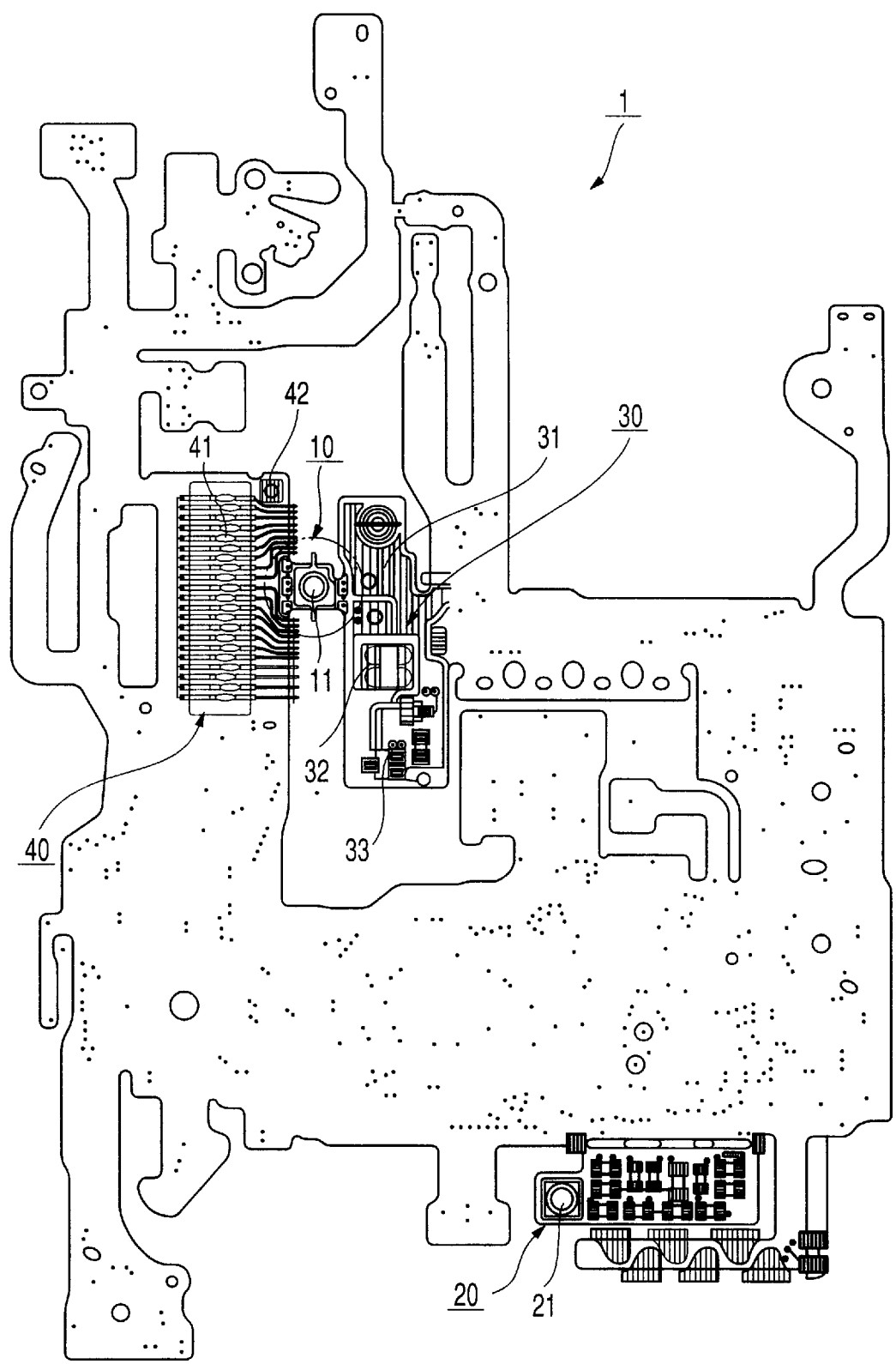
FIG. 2 is a view showing how predetermined circuit parts are mounted and arranged on the base of the electric substrate in FIG. 1.

Next, FIG. 2 shows a view showing how predetermined circuit parts are mounted and arranged on the base of the printed substrate 1 in FIG. 1. That is, a predetermined mounting operation is performed with the set of positioning holes 11 and 21 fixed to the correct positions for positioning for a mounter machine. The mounter machine uses soldering or other means to sequentially mount required parts (electric elements) on, for example, a base member with illustrated pattern circuits (31, 32, 33, 41, and 42) printed thereon.

The illustrated mounting example, however, does not necessarily relate to a mounting order and partly describes the mounting areas 30 and 40 around the positioning hole 11 and mounting areas around the other positioning hole 21.

The layout structure of the above described printed substrate will be described in detail with reference to FIGS. 3A and 3B.

FIG. 3A shows the positioning substrate section 10, which is a geometric characteristic of the flexible printed substrate 1, and its peripheries in an enlarged view. As described above, the opposed substrate areas include the mounting area 30 or the first area in which parts are mounted, and the mounting area 40 or the second area. The positioning substrate section 10 or the third area having the circular positioning hole 11 centrally formed therein to tie the first and second areas together like a "bridge" is formed so as to be separable after predetermined parts (not shown) have been mounted. Thus, a row of small holes 15 (perforations 15a to 15h) and a row of small holes 16 (perforations 16a to 16f) are each disposed like through holes in a boundary between corresponding adjacent areas and the positioning substrate section 10 so that the positioning substrate section 10 can be manually easily torn off from the adjacent areas. Peripheral structures of the rows of small holes 15 and 16 are fragilely formed only of a partly thin base material for easy cut-off (the sectional structure is described below).

In the positioning substrate section 10, a connection 10A acting as a bridge is extended substantially rectangularly so as to connect the first area 30 and the second area 40 and the third area 10 together and is covered with a cover lay 18.

The perforations 15a to 15h constituting the row of small holes 15 for separation are linearly arranged along the boundary between the third area 10 and the second area 40, while the perforations 16a to 16f constituting the row of small holes 16 for separation are linearly arranged along the boundary between the third area 10 and the first area 30. Thus, this structure can be torn off along the perforations (15a to 15h and 16a to 16f) constituting the two rows of small holes or can be easily cut off with a cutter or the like.

FIG. 3B is a sectional view taken along line 3B—3B passing through the perforations 15e and 16c in FIG. 3A, showing the sectional structure of the positioning substrate section 10 or the cut-off third area. This section has a cover lay opening 19 formed only of the base material. As described above, the positioning hole 11, that is, one circular opening is formed in a base member stretched from the base members of the adjacent mounting areas 30 and 40, and in peripheries of the positioning hole 11 or a first positioning hole, a part constituting a ring portion 12 has a reinforcing section 13 of a copper foil pattern layer formed around a periphery thereof and on both a front and rear sides thereof, the reinforcing section 13 being covered with the cover lay 18.

That is, the positioning substrate section (third area 10) is provided to act as a "bridge" across the first area 30 and the second area 40 in which main parts (not shown) are mounted, and is formed so as to be easily cut off when the substrate is integrated into a camera. The row of small holes 15 (perforations 15a to 15h) are formed in the boundary between the third area 10 and the second area 40 for separation, while the row of small holes 16 (perforations 16a to 16f) are formed in the boundary between the third area 10 and the first area 30 for separation.

The positioning substrate section 10 is formed so as to be cut off from the flexible printed substrate 1 after all the electric parts have been mounted on the flexible printed substrate 1.

The second positioning hole 21 paired with the first positioning hole 11 formed in the third area 10 is formed in a second positioning substrate section (that is, a fourth area) 20 located away from the first positioning hole 11.

The positioning hole 11 in the positioning substrate section (third area) 10 and the positioning hole 21 in the positioning substrate section 20 are spaced relatively distantly.

As described above, when the flexible printed substrate 1 according to this embodiment is configured to be positioned using the positioning holes 11 and 21, since it is difficult to form desired positioning holes in such a flexible printed circuit 1 having a high-density pattern circuit without affecting the pattern circuit, the space (third area 10) with the first positioning hole 11 formed therein is formed in a site having no relation with the flexible printed substrate 1 main body as shown in FIG. 1 and the third area 10 is used to connect the first area 30 and the second area 40 together at least during the mounting step, so that the flexible printed substrate 1 is kept planar so as not to be deformed, floated, or shifted in a narrow site.

In addition, when the flexible printed substrate 1 is assembled into a product main body such as a camera, the positioning substrate section (third area) 10 with the connection 10A prevents the first area 30 and the second area 40 from being separately folded for disposition; that is, this structure provides no degree of freedom to preclude the substrate from being integrated into the camera. Accordingly, for example, the perforations are formed to enable the third area 10 to be removed before the integration, thereby facilitating cut-off and thus integration.

By providing the positioning substrate section 10 as a "bridge" and forming and locating the positioning hole 11 therein, the correct positioning and planarity of the substrate 1 are maintained during an operation for mounting parts on the flexible printed substrate 1 using the mounter machine. Moreover, since the positioning substrate section 10 is not provided within a main circuit pattern, separating and removing it after the mounting operation prevents a substantial increase in the area of the electric substrate despite its formation in the new space. Consequently, the area of the electric substrate decreases compared to the conventional example in which the positioning substrate section is extended adjacent to the circuit pattern (reference 5 in FIG. 4), thereby miniaturizing the electric substrate.

(Variation)

The above described first embodiment may be varied as follows: the illustrate embodiment includes only one separable positioning substrate section (that is, the third area 10), but instead of the positioning substrate section 20 or the fourth area, a second positioning substrate section 20 may be provided at a position where it can act similarly as a bridge and may be formed to be separable.

In addition, the separable structure need not necessarily comprise the prearranged row of small holes such as the perforations as shown in the drawings but may be a marking for cut-off. Alternatively, the separation section may be formed extremely thin for easy cut-off.

These variations are expected to provide effects equivalent to or higher than those of the previously illustrated embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A printed electric substrate for electronic equipment on which electronic parts are mounted using an electronic part mounting device, the electric substrate comprising:

a first area provided in said electric substrate;

a second area also provided in said electric substrate, and branching from said first area; and a third area formed at a different position from a position at which said second area branches from said first area for tying said first area and said second area together and keeping said first and second areas in a flat state, said third area having a positioning hole formed to position and set said electric substrate in said electronic part mounting device, and said third area being formed to be separable from said electric substrate on which said electronic parts have been mounted using said electronic part mounting device, when said electric substrate is assembled into said electronic equipment after being removed from said electronic part mounting device;

wherein even after said third area is separated from said electric substrate, said first and second areas remain provided in said electric substrate.

2. The electric substrate according to claim 1, wherein said electric substrate comprises a flexible printed substrate.

3. The electric substrate according to claim 1, wherein said first, second, and third areas are integrally formed in a single said electric substrate.

4. The electric substrate according to claim 1, further comprising a separation structure formed between said first and second areas and said third area.

5. The electric substrate according to claim 1, further comprising an additional positioning hole formed in said electric substrate at a predetermined interval from said positioning hole formed in said third area, for positioning said electric substrate in said electronic part mounting device.

6. The electric substrate according to claim 5, wherein an area with said second positioning hole formed therein is also formed so as to be separable from said electric substrate when said electric substrate with said electronic parts mounted thereon is assembled into said electronic equipment.

7. The electric substrate according to claim 1, wherein said electric substrate has an external shape configured so that said first area and said second area and said third area form a closed loop.

8. A flexible printed electric substrate on which electronic parts are mounted using an electronic part mounting device and which is adapted to be integrated into electronic equipment, the flexible printed electric substrate comprising:

a first substrate section and a second substrate section which branch from each other while being connected to each other, and which have areas on which said electronic parts are mounted and a connection pattern for transmitting an electric signal, said first and second substrate sections being in a flush state when said electronic parts are mounted using said electronic part mounting device, and being cleared of said flush state when said flexible printed electric substrate with said electronic parts mounted thereon is assembled into said electronic equipment;

a positioning substrate section formed integrally with said flexible printed electric substrate at a different position from a position at which said first substrate section and said second substrate section branch from each other so as to bridge across said first substrate section and said second substrate section in such a way so as to keep said first substrate section and said second substrate section in a substantially uniform flat state, said positioning substrate section having a positioning hole for positioning and setting said flexible printed electric substrate relative to said electronic part mounting device; and separation structure means for enabling said positioning substrate section to be cut of from said first and second substrate sections of said flexible printed electric substrate on which said electronic parts have been mounted, when said flexible printed electric substrate is assembled into said electronic equipment.

9. The electric substrate according to claim 8, wherein said separation structure means comprises a marking for use in cutting said positioning substrate section off from said flexible printed electric substrate to facilitate the cutting-off.

10. The electric substrate according to claim 8, wherein said separation structure means comprises a plurality of holes arranged in a row.

11. The electric substrate according to claim 8, wherein said separation structure means comprises a base material which is not covered by a cover lay.

12. A manufacturing method for integrating a flexible printed electric substrate into predetermined electronic equipment, the flexible printed electric substrate being adapted to have electronic parts mounted thereon using an electronic part mounting device, the method comprising:

manufacturing a flexible printed electric substrate having formed therein: (i) a first substrate section and a second substrate section which are formed to be connected to each other, said first and second substrate sections having areas on which said electronic parts are mounted and a connection pattern for transmitting an electric signal, and (ii) a positioning substrate section formed at a different position from a position at which said first substrate section and said second substrate section are connected to each other and having a positioning hole for positioning and setting said flexible printed electric substrate in said electronic part mounting device, said positioning substrate section bridging across said first substrate section and said second substrate section in such a way as to keep said first substrate section and said second substrate section in a substantially uniform flat state;

mounting said flexible printed electric substrate on the electronic part mounting device using the positioning hole formed in said positioning substrate section to mount said electronic parts on said first substrate section and second substrate section of said flexible printed electric substrate;

removing said flexible printed electric substrate from the electronic part mounting device, and then cutting said positioning substrate section off from said first substrate section and second substrate section of said flexible printed electric substrate; and separately freely folding said first substrate section and second substrate section of said flexible printed electric substrate with said positioning substrate section cut off therefrom, to assemble said first substrate section and said second substrate section into said electronic equipment.

\* \* \* \* \*